(12) United States Patent
Fan et al.

(10) Patent No.: US 7,626,874 B1
(45) Date of Patent: Dec. 1, 2009

(54) METHOD AND APPARATUS FOR TESTING A MEMORY DEVICE WITH A REDUNDANT SELF REPAIR FEATURE

(75) Inventors: Yuezhen Fan, San Jose, CA (US); Zhi-Min Ling, Cupertino, CA (US); Arnold A. Cruz, Fremont, CA (US)

(73) Assignee: XILINX, Inc., San Jose, CA (US)

( * ) Notice: Subject to any disclaimer, the term of this patent is extended or adjusted under 35 U.S.C. 154(b) by 331 days.

(21) Appl. No.: 11/709,985

(22) Filed: Feb. 23, 2007

(51) Int. Cl.
*G11C 7/00* (2006.01)

(52) U.S. Cl. .................. 365/201; 365/200; 365/185.09; 714/718

(58) Field of Classification Search .................. 365/201, 365/200, 185.09; 714/718
See application file for complete search history.

(56) References Cited

U.S. PATENT DOCUMENTS

| | | | | |
|---|---|---|---|---|
| 6,452,845 | B1 * | 9/2002 | Merritt | 365/201 |
| 6,590,816 | B2 * | 7/2003 | Perner | 365/200 |
| 7,486,111 | B2 * | 2/2009 | Madurawe | 326/38 |

* cited by examiner

*Primary Examiner*—Son Dinh
*Assistant Examiner*—Nam Nguyen
(74) *Attorney, Agent, or Firm*—Kin-Wah Tong

(57) ABSTRACT

A test methodology for testing a memory device with a RSR feature is disclosed. For example, a method for testing a memory device having at least one memory cell group, at least one redundant memory cell group, and a defect detect register is disclosed. In one embodiment, the method applies at least one memory test to the at least one memory cell group; and applies a defect detect register test to the defect detect register.

20 Claims, 3 Drawing Sheets

United States Patent

METHOD AND APPARATUS FOR TESTING A MEMORY DEVICE WITH A REDUNDANT SELF REPAIR FEATURE

FIELD OF THE INVENTION

One or more aspects of the present invention relate generally to a test methodology and, in particular, to a test methodology related a memory device with a redundant self repair feature.

BACKGROUND OF THE INVENTION

A manufacturer of memory devices will often implement a production test strategy to ensure that the memory devices will meet one or more performance or reliability requirements. However, as the complexity of memory devices increases, it is important to ensure that the test methodology is able to guarantee the quality of the memory devices. For example, memory devices may be produced with a redundant self repair feature, where the memory devices are capable of detecting a failed memory location having one or more failed memory cells and then can activate a redundant group of memory cells to replace the failed memory cells. This redundant self repair (RSR) feature increases test escape concern of the memory devices. Thus, there is a need to provide a test methodology that tests a memory device with a RSR feature.

SUMMARY OF THE INVENTION

In one embodiment, a test methodology for testing a memory device with a RSR feature is disclosed. For example, an embodiment of the present invention provides a method for testing a memory device having at least one memory cell group, at least one redundant memory cell group, and a defect detect register. In one embodiment, the method applies at least one memory test to the at least one memory cell group; and applies a defect detect register test to the defect detect register.

BRIEF DESCRIPTION OF THE DRAWINGS

Accompanying drawing(s) show exemplary embodiment(s) in accordance with one or more aspects of the invention; however, the accompanying drawing(s) should not be taken to limit the invention to the embodiment(s) shown, but are for explanation and understanding only.

DETAILED DESCRIPTION OF THE DRAWINGS

Figure 1:
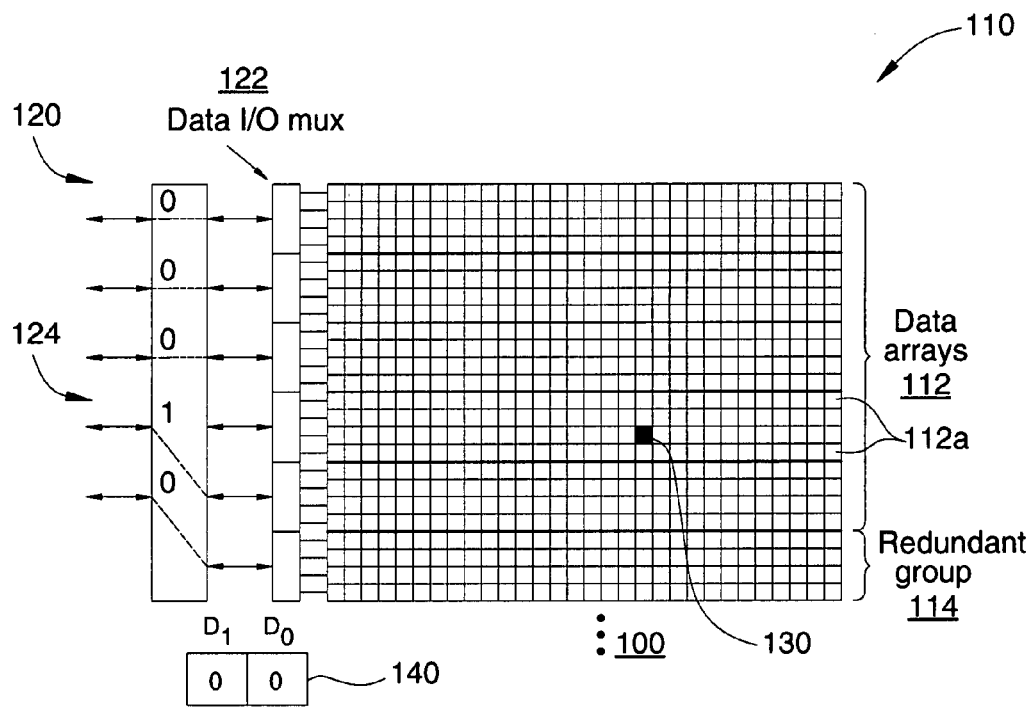
FIG. 1 illustrates a memory device having a memory array section with an array defect detection register.

FIG. 1 illustrates a memory device or circuit 100 having memory array section 110 with an array defect detection register 120. The memory array section 110 comprises a plurality of memory cell groups 112 (also known collectively as a data array section) and one or more redundant memory cell groups 114. Although FIG. 1 illustrates each memory cell group as comprising four (4) rows of memory cells, this is only illustrative and should not be interpreted as a limitation of the present invention. For example, in some embodiments fewer or more rows may form a memory group, or the memory may be organized by columns instead of rows. FIG. 1 also illustrates a non-volatile memory 140 that is capable of storing memory defect status information as discussed below. In some embodiments, the memory array 110 may be part of a standalone memory device. In other embodiments, one or more memory arrays or devices may be included as part of an integrated circuit, such as a Field-Programmable Gate Array (FPGA). For example, in some FPGA embodiments, the memory array may be used as configuration memory for the FPGA, and/or as block RAM (BRAM) of the FPGA.

More specifically, memory device or circuit 100 is equipped with a redundant self repair (RSR) feature such that if one of the memory cell groups 112 is detected to have a failure, then one of the redundant memory cell groups 114 is activated to replace the failed memory cell group 112. For example, to save yield from static random access memory (SRAM) single bit, bit line or word line failures, redundant memory cell groups 114 are implemented in either stand alone or embedded SRAM blocks. For example, a Built in Self Test (BIST) may be employed to detect a failing memory cell location (e.g., memory cell 130 as shown in FIG. 1) at a power up stage or at the beginning of a Field-Programmable Gate Array (FPGA) configuration. The failing memory location will be stored in the dedicated defect detection register 120, e.g., by setting a correspond bit as a value of "1" (e.g., 124), while all the other register bits are held at the default value of "0".

In turn, a RSR circuit will then replace the memory cell group 112a in which the faulty memory cell 130 resides with one of the redundant memory cell group 114, e.g., via a ripple shift. In other words, access to the faulty memory cell group containing the faulty memory cell is prohibited, e.g., access to the input/output multiplexer (I/O mux) 122 corresponding to the faulty memory cell group is denied. Instead, access to the faulty memory cell group is then redirected to a next successive memory group that is below the faulty memory cell group, e.g., as shown in FIG. 1. This ripple shifting of the memory cell groups is propagated until one of the redundant memory cell groups is shifted into service as one of the memory cell group of the data array 112. Thus, as memory cell failures occur and are detected during the operation of the memory device 100, redundant memory cell groups are activated to replace the failed memory cell group. Thus, memory devices with the RSR feature provides memory redundancy, thereby increasing the yield of the memory devices. Other techniques for implementing RSR may also be used in accordance with embodiments of the present invention. For example, rather than ripple shifting memory cell groups, a redundant memory group may directly substitute for the faulty memory cell group.

However, the increased complexity of the memory devices with the RSR feature also increases the complexity of the test methodology that is employed to ensure that memory devices with the RSR feature will meet the guaranteed reliability as represented to customers. Furthermore, it is also necessary to provide a method to track the reliability of the memory devices with the RSR feature.

Figure 2:
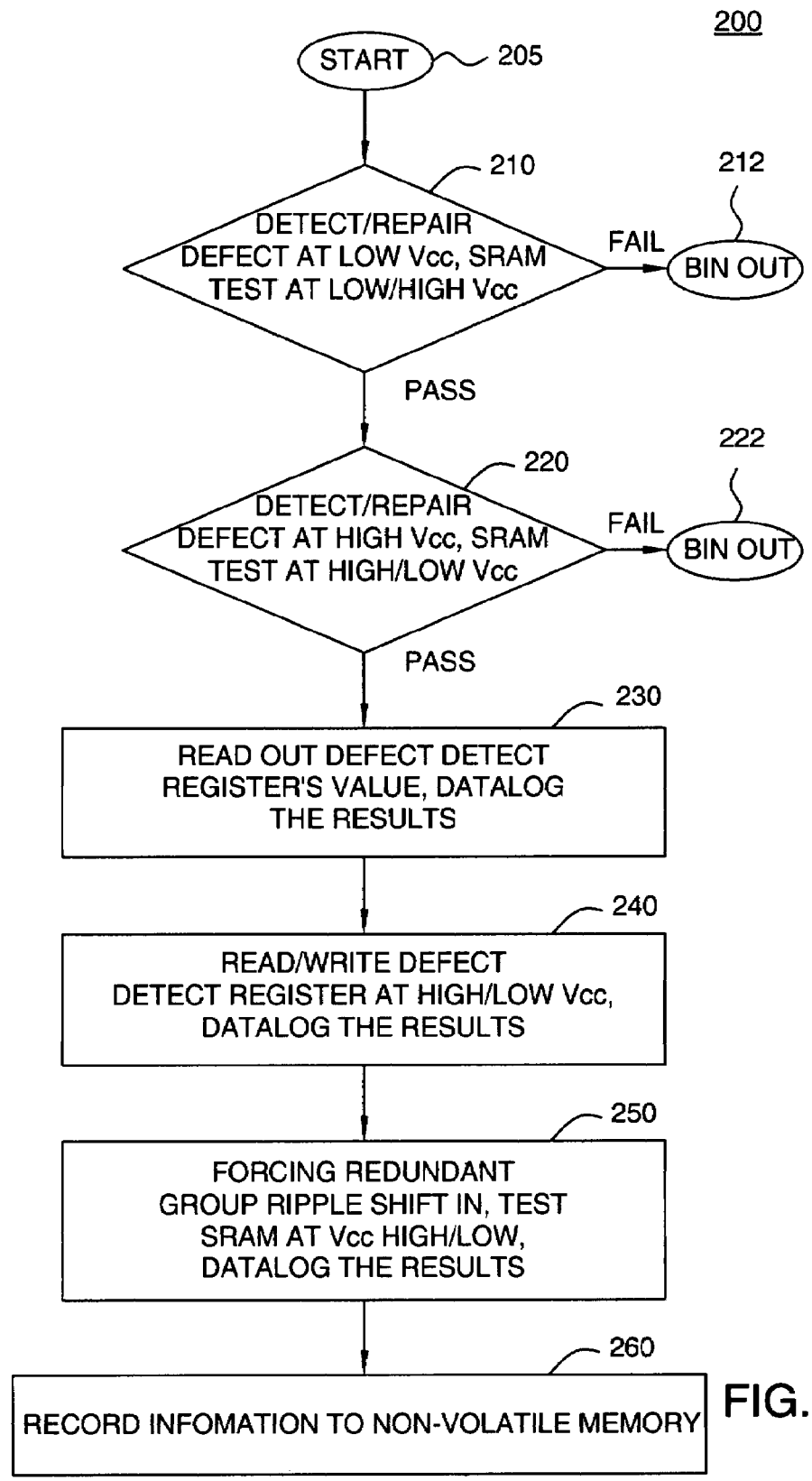
FIG. 2 illustrates a flow chart of a method for testing a memory device with a RSR feature in accordance with embodiments of the present invention.

FIG. 2 illustrates a flow chart of a method 200 for testing a memory device with a RSR feature in accordance with embodiments of the present invention. For example, method 200 can be implemented by a test platform at a manufacturing facility where the memory devices or dies are manufactured.

Method 200 starts in step 205 and proceeds to step 210. In step 210, method 200 triggers a detect/repair defect test to be performed when a low operating voltage, e.g., a low Vcc, is applied to the memory device. It should be noted that a memory device is often designed to operate within a range of operating voltages, e.g., between a low Vcc and a high Vcc, e.g., 0.85 volts to 1.15 volts. As such, in step 210, the detect/repair defect test is triggered when a low Vcc, e.g., 0.85 volts, is applied to the memory device. In one embodiment, the detect/repair defect test is a test that is triggered during startup or reconfiguration of the memory device. The detect/repair defect test is described above where a test routine is executed to determine whether one of the memory cell group is defective. If so, the detect/repair defect test will set a corresponding bit to a value of "1" in the defect detection register 120 to cause one of the redundant memory cell group to be activated for use to replace the defective memory cell group. Once the detect/repair defect test is completed and, if necessary, a defective memory cell group has been detected and replaced, then a series of memory tests (e.g., SRAM tests) are applied. These memory tests comprise function tests that are designed to test the data array section of the memory device to ensure that it is operating properly. These memory tests are initially performed at the low Vcc and then they are repeated at the high Vcc. Repeating the memory tests at both low and high Vcc ensures that intermittent failures that are triggered by changes in the operating voltage are detected before the memory device is deemed to be defect free. Note that in some embodiments, the memory test may not be repeated, for example when it is more efficient to test at only one voltage Vcc. In other embodiments, the memory test may be repeated several times for many possible voltages (including more than two voltages) over a range of voltages. In some embodiments, testing may be repeated for other test conditions, such as different temperatures.

In step 210, if the memory tests at both low and high Vcc are passed, then method 200 proceeds to step 220. However, if either of the low Vcc memory test or the high Vcc memory test fails, then method 200 proceeds to step 212, where the memory device is deemed to be defective. Furthermore, it should be noted that if the detect/repair defect test in test 210 indicates that there is a detected defect that cannot be repaired (e.g., not having sufficient number of redundant memory cell groups to replace the number of detected failed memory cell groups), then method 200 will also proceed to step 212, where the memory device is deemed to be defective.

In step 220, method 200 triggers a second detect/repair defect test to be performed where a high operating voltage, e.g., a high Vcc, is applied to the memory device. As discussed above, a memory device is often designed to operate within a range of operating voltages, e.g., between a low Vcc and a high Vcc, e.g., 0.85 volts to 1.15 volts. As such, in step 220, the detect/repair defect test is again triggered where a high Vcc, e.g., 1.15 volts, is applied to the memory device. In other words, the memory device is powered down and then a high operating voltage is applied to the memory device. The second detect/repair defect test is intended to ensure that defects that are detectable only with a high Vcc will be detected and replaced with the redundant memory cell groups. Once the second detect/repair defect test is completed and, if necessary, a defective memory cell group has been detected and replaced, then the series of memory tests (e.g., SRAM tests) are again applied. As discussed above, these memory tests comprise function tests that are designed to test the data array section of the memory device to ensure that it is operating properly. In step 220, these memory tests are initially performed at the high Vcc and then they are repeated at the low Vcc.

In step 220, if the memory tests at both high and low Vcc are passed, then method 200 proceeds to step 230. However, if either of the high Vcc memory test or the low Vcc memory test fails, then method 200 proceeds to step 222, where the memory device is deemed to be defective. Furthermore, it should be noted that if the detect/repair defect test in test 220 indicates that there is a detected defect that cannot be repaired (e.g., not having sufficient number of redundant memory cell groups to replace the number of detected failed memory cell groups), then method 200 will also proceed to step 222, where the memory device is deemed to be defective.

In step 230, method 200 reads out the values that have been stored in the defect detect register 120 and stores the values. For example, if the detect/repair defect tests in steps 210 and 220 did not detect any defects in the memory cell groups 112, then the values stored in the defect detect register 120 will be a series of "0"s. Alternatively, if the detect/repair defect tests in steps 210 and 220 did detect defects in the memory cell groups 112, then the values stored in the defect detect register 120 will comprise mostly of "0"s with one or more "1"s at the corresponding locations of the defect detect register 120 that correspond to the failed memory cell groups.

In step 240, method 200 accesses each bit (e.g., read and write) of the defect detect register 120 (broadly defined as a defect detect register test). For example, method 200 will write a "1" to each bit and then write a "0" to each bit. After each write operation, method 200 will read the bit to ensure that the value reflects the value that was written to the bit. Namely, the method cycles each bit of the plurality of bits in the defect detect register between two different values. This read/write operation is performed for the entire defect detect register 120. This test ensures that defects in the defect detect register 120 are detected and recorded. Furthermore, the defect detect register test is applied at both low Vcc and high Vcc. The result is then recorded.

In one alternate embodiment, the results from step 240 are optionally compared to the results recorded in step 230. For example, if a bit in the defect detect register is set to a value of "1," then the results in step 230 should indicate that the memory cell group corresponding to that bit is defective. However, if the results in step 240 indicate that the bit carrying the value of "1" is actually stuck at the value of "1", then the compare operation will reveal that the memory cell group associated with that bit is likely defect free and that the defect is actually attributable to that particular bit in the defect detect register 120. Since a redundant memory cell group has already been activated to replace the "allegedly" defective memory cell group, there is no real harm in having that defective bit in the defect detect register 120, although it may be useful for tracking reliability of the memory array to record that the memory array includes this harmless defect.

However, if all the bits in the defect detect register are set to a value of "0," then the results in step 230 should indicate that none of the memory cell groups is defective. However, if the results in step 240 indicate that one of the bits carrying the value of "0" is actually stuck at the value of "0", then the compare operation will reveal that although the memory cell group associated with that bit is now defect free, if that memory cell group does experience a failure in the future, then a redundant memory cell group cannot be activated to replace that particular memory cell group. In other words, since the bit in the defect detect register cannot be written to hold the value of "1", that particular memory cell group cannot be replaced with a redundant memory cell group in the future. Since the memory cell group is currently operating normally (e.g., having passed various memory tests in steps 210 and 220), there is no real harm yet in having that defective bit in the defect detect register 120. However, as previously noted, it may be useful to record the fact that the memory array includes this harmless defect.

Thus, the results from the compare operation are also recorded in step 240. The results can be stored to support reporting and tracking functions.

Figure 3:
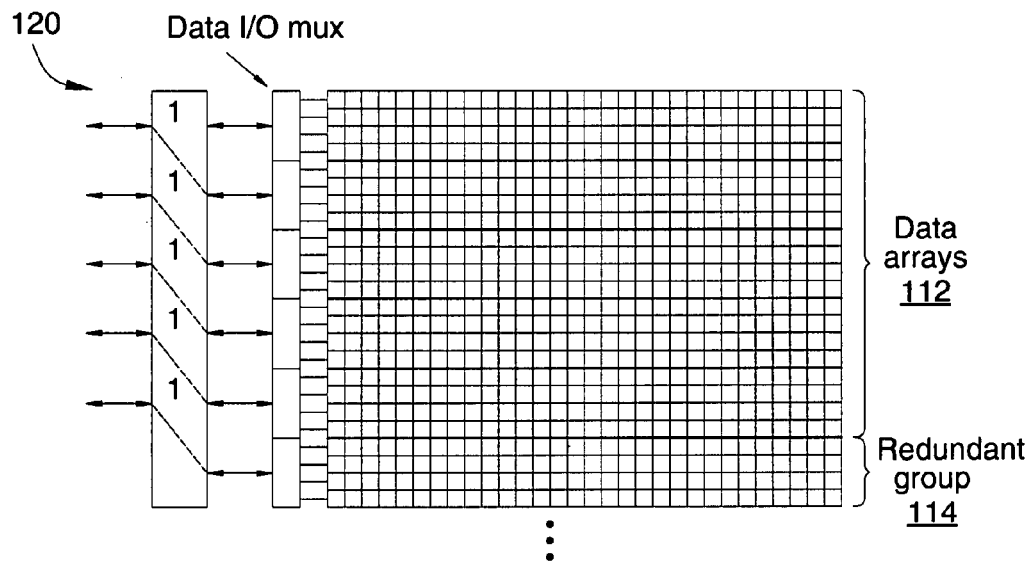
FIG. 3 illustrates a memory array section with an array defect detection register with all values in the array defect detection register being set to "1"

In step 250, method 200 tests the redundant memory cell groups 114. It should be noted that memory tests that are applied to the memory cell groups 112 of the data arrays may not have been applied to the redundant memory cell groups 114. One reason is that the redundant memory cell groups 114 may not have been activated to replace any of the memory cell groups 112. In step 250, method 200 forces all the redundant memory cell groups to be shifted into the data arrays, e.g., by causing one or more of the memory cell groups 112 to be replaced by the redundant memory cell groups 114. This is illustrated in FIG. 3 with the bits in the defect detect register 120 associated with the memory cell groups 112 written with the value of "1", thereby causing all the redundant memory cell groups 114 to be activated to be part of the data array section of the memory device. Once activated, method 200 then applies the series of memory tests (e.g., SRAM tests) as discussed in steps 210 and 220. As discussed above, these memory tests comprise function tests that are designed to test the data array section of the memory device to ensure that it is operating properly. Again, the series of memory tests is applied in both high Vcc and low Vcc. It should be noted that the memory tests are also capable of testing the data I/O mux 122 and the data lines that are coupling the I/O mux 122 to the memory cell groups 112 and redundant memory cell groups 114. The results are again stored to support reporting and tracking functions.

In step 260, results from various tests as discussed above (or more broadly memory defect status information) can be optionally stored onto non-volatile memory located on the memory device or die. For example, before the memory device is shipped to a customer, the test results are stored in the non-volatile memory of the memory device. The ability to store such test results directly on the memory device enhances the ability to track the reliability and performance of the memory device. For example, if a memory device is returned from the field by a customer, it would be possible to read the non-volatile memory of the memory device to determine the initial condition of the memory device prior to being shipped to the customer. With this information, it would be possible to trace back or to track the performance of the memory device after the memory device has been subjected to various stresses.

To illustrate, Table 1 illustrates one embodiment of the information that can be stored in the non-volatile memory of the memory device.

TABLE 1

| Defect Status | d1 | d0 |
|---|---|---|
| Defect free | 0 | 0 |
| Defect in SRAM array, but replaced by redundant memory cell group | 0 | 1 |
| Defect in defect detect register | 1 | 0 |
| Defect in unused redundant memory | 1 | 1 |

In one embodiment, a non-volatile memory comprising two bits (e.g., d1, d0 as shown in Table 1) is used to store the test results. To illustrate, if the memory device is completely defect free (e.g., the memory cell groups 112, the redundant memory cell groups 114, and the defect detect register 120 are all defect free), then the value (0, 0) may be stored in the non-volatile memory. Second, if the memory device is not completely defect free (e.g., one or more memory cell groups 112 have been replaced by one or more redundant memory cell groups 114), then the value (0, 1) may be stored in the non-volatile memory. Third, if the memory device is not completely defect free (e.g., at least one bit of the defect detect register that is associated with the memory cell groups 112 is defective), then the value (1, 0) may be stored in the non-volatile memory. Finally, if the memory device is not completely defect free (e.g., one or more redundant memory cell groups 114 that are not currently being used are defective), then the value (1, 1) may be stored in the non-volatile memory. It should be noted that since only two bits are available, there may be scenarios where two conditions in Table 1 may exist simultaneously. In such situations, the condition with a higher order on Table 1 may be recorded in the non-volatile memory. For example, if the memory device has at least one bit in the defect detect register that is associated with the memory cell groups 112 that is defective, and one or more redundant memory cell groups 114 that are not currently being used that are defective, then the value of (1, 0) may be written into the non-volatile memory.

Figure 4:
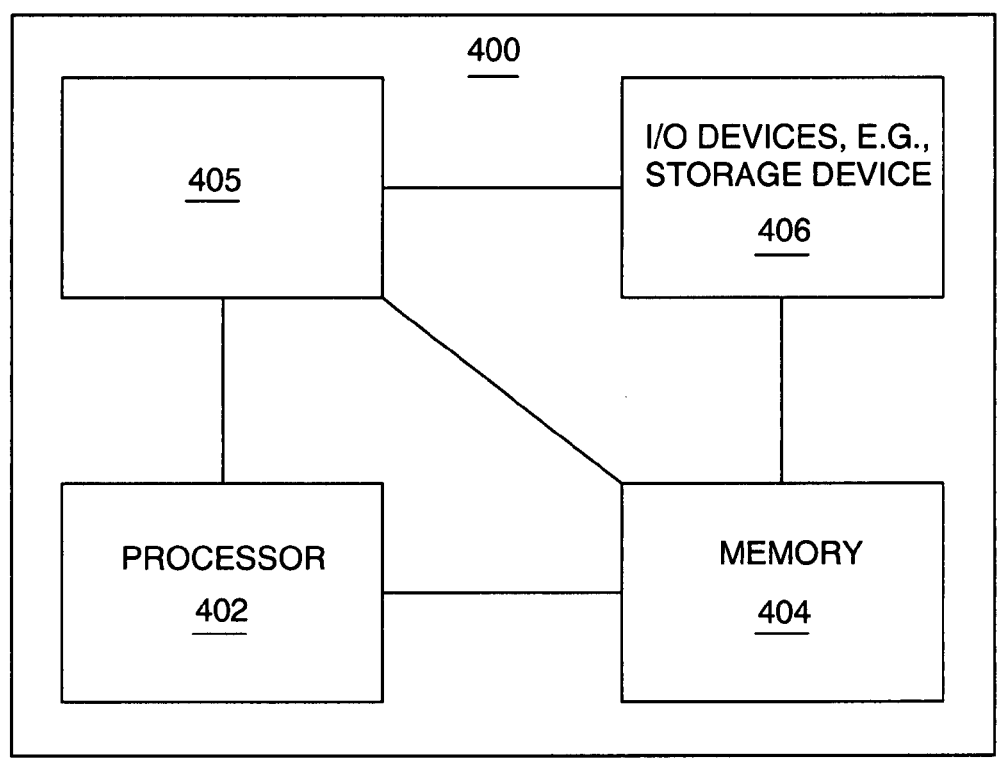
FIG. 4 illustrates a high level block diagram of a general purpose computer suitable for use in performing the functions described herein.

FIG. 4 depicts a high level block diagram of a general purpose computer suitable for use in performing some or all of the functions described herein. As depicted in FIG. 4, the system 400 comprises a processor element 402 (e.g., a CPU), a memory 404, e.g., random access memory (RAM) and/or read only memory (ROM), a module 405 for testing a memory device with a RSR feature, and various input/output devices 406 (e.g., storage devices, including but not limited to, a tape drive, a floppy drive, a hard disk drive or a compact disk drive, a receiver, a transmitter, a speaker, a display, a speech synthesizer, an output port, and a user input device (such as a keyboard, a keypad, a mouse, and the like)).

It should be noted that embodiments of the present invention can be implemented in software and/or in a combination of software and hardware, e.g., using application specific integrated circuits (ASIC), a general purpose computer or any other hardware equivalents. In one embodiment, the present module or process for testing a memory device with a RSR feature can be loaded into memory 404 and executed by processor 402 to implement the functions as discussed above. As such, the present module or process 405 for testing a memory device with a RSR feature (including associated data structures) of embodiments of the present invention can be stored on a computer readable medium or carrier, e.g., RAM memory, magnetic or optical drive or diskette and the like.

It should be noted that the non-volatile memory is not limited to having two bits. Any number of bits can be employed to store the test results. If additional bits are employed, then additional test information can be stored onto the memory device. Also, in embodiments having two bits, codes other than the ones presented in Table 1 may be used.

While the foregoing describes exemplary embodiment(s) in accordance with one or more aspects of the present invention, other and further embodiment(s) in accordance with the one or more aspects of the present invention may be devised without departing from the scope thereof, which is determined by the claim(s) that follow and equivalents thereof. Claim(s) listing steps do not imply any order of the steps. Trademarks are the property of their respective owners.

What is claimed is:

1. A method for testing an integrated circuit including a memory device, wherein said memory device comprises at least one memory cell group, at least one redundant memory cell group, and a defect detect register, comprising:
   applying at least one memory test to said at least one memory cell group; and
   applying a defect detect register test to said defect detect register to determine if at least one bit of said defect detect register is defective.

2. The method of claim 1, wherein said at least one memory test is applied when a high operating voltage is applied to said memory device.

3. The method of claim 1, wherein said at least one memory test is applied when a low operating voltage is applied to said memory device.

4. The method of claim 1, further comprising:
   applying at least one memory test to said at least one redundant memory cell group.

5. The method of claim 4, wherein said applying at least one memory test to said at least one redundant memory cell group comprises:
   activating all of said at least one redundant memory cell group to replace one or more of said at least one memory cell group; and
   applying said at least one memory test to said activated at least one redundant memory cell group.

6. The method of claim 4, wherein said at least one memory test is applied to said activated at least one redundant memory cell group when at least one of a high operating voltage and a low operating voltage is applied to said memory device.

7. The method of claim 4, wherein said at least one memory test is applied to said activated at least one redundant memory cell group over a range of test conditions.

8. The method of claim 1, wherein said applying said defect detect register test to said defect detect register comprises:
   reading out a plurality of values stored in a plurality of bits of said defect detect register after said at least one memory test is applied;
   cycling each bit of said plurality of bits in said defect detect register between two different values; and
   comparing results from said reading out and said cycling to determine if said at least one bit of said plurality of bits of said defect detect register is defective.

9. The method of claim 1, further comprising:
   recording memory defect status information onto said memory device.

10. The method of claim 9, wherein recording said memory defect status information comprises recording onto a non-volatile memory located on said memory device.

11. The method of claim 1, wherein the integrated circuit is a field-programmable gate array (FPGA), and the memory device is a memory of the FPGA.

12. A computer-readable medium having stored thereon a plurality of instructions, the plurality of instructions including instructions which, when executed by a processor, cause the processor to perform the steps of a method for testing an integrated circuit including a memory device, wherein said memory device comprises at least one memory cell group, at least one redundant memory cell group, and a defect detect register, comprising:
   applying at least one memory test to said at least one memory cell group; and
   applying a defect detect register test to said defect detect register to determine if at least one bit of said defect detect register is defective.

13. The computer-readable medium of claim 12, wherein said at least one memory test is applied when a high operating voltage is applied to said memory device.

14. The computer-readable medium of claim 12, wherein said at least one memory test is applied when a low operating voltage is applied to said memory device.

15. The computer-readable medium of claim 12, further comprising:
   applying at least one memory test to said at least one redundant memory cell group.

16. The computer-readable medium of claim 15, wherein said applying at least one memory test to said at least one redundant memory cell group comprises:
   causing all of said at least one redundant memory cell group to be activated for replacing one or more of said at least one memory cell group; and
   applying said at least one memory test to said activated at least one redundant memory cell group.

17. The computer-readable medium of claim 15, wherein said at least one memory test is applied to said activated at least one redundant memory cell group when at least one of a high operating voltage and a low operating voltage is applied to said memory device.

18. The computer-readable medium of claim 11, wherein said applying said defect detect register test to said defect detect register comprises:
   reading out a plurality of values stored in a plurality of bits of said defect detect register after said at least one memory test is applied;
   cycling each bit of said plurality of bits in said defect detect register between two different values; and
   comparing results from said reading out and said cycling to determine if said at least one bit of said plurality of bits of said defect detect register is defective.

19. The computer-readable medium of claim 11, further comprising:
   recording memory defect status information onto said memory device.

20. An apparatus for testing an integrated circuit including a memory device, wherein said memory device comprises at least one memory cell group, at least one redundant memory cell group, and a defect detect register, comprising:
   means for applying at least one memory test to said at least one memory cell group; and
   means for applying a defect detect register test to said defect detect register to determine if at least one bit of said defect detect register is defective.

* * * * *